April 7, 1959 D. D. HOLMES 2,881,310

FREQUENCY COMPENSATION FOR GAIN CONTROLLED TRANSISTOR CONVERTER CIRCUIT

Filed Nov. 26, 1956 2 Sheets-Sheet 1

INVENTOR.

David D. Holmes

BY [signature]

ATTORNEY.

INVENTOR.
David D. Holmes
BY H. C. Newton
ATTORNEY.

United States Patent Office 2,881,310 Patented Apr. 7, 1959

2,881,310

FREQUENCY COMPENSATION FOR GAIN CONTROLLED TRANSISTOR CONVERTER CIRCUIT

David D. Holmes, Princeton, N.J., assignor to Radio Corporation of America, a corporation of Delaware Application November 26, 1956, Serial No. 624,312

16 Claims. (Cl. 250—20)

This invention relates in general to transistor signal translating circuits, and in particular to frequency converter circuits utilizing transistors as active elements suitable for use in superheterodyne signal receiving systems and the like.

Frequency converter circuits are used in superheterodyne signal receiving systems to convert a received carrier wave signal to an intermediate frequency signal. In most commercial radio receivers using transistors, a single transistor is used to perform this function. For many applications, principally in receivers where a wide range of input signals are received, it is desirable to apply automatic gain control (AGC) to the converter. If gain control is not applied to the converter, the signal handling capacity of the receiver may be limited due to overload of the first intermediate frequency amplifying stage of the receiver, to which automatic gain control is usually applied. While gain control of the converter is thus desirable in many applications, it has been found to be accompanied, where used, by an undesirable shift in the oscillator frequency of the converter. This unwanted frequency shift is produced by a reduction of the transistor input capacitance as the emitter current is reduced due to the application of automatic gain control.

It is accordingly an object of this invention to provide an improved gain-controlled transistor frequency-converter circuit for signal receiving systems which is not subject to undesirable shifts in oscillator frequency.

It is another object of this invention to provide an improved frequency converter circuit for signal receivers with a transistor as the active element therein, which operates to compensate for frequency shifts in the oscillator portion of the circuit due to the application of automatic gain control thereto.

It is still another object of this invention to provide means, in a radio signal receiving system employing a single transistor as the active element of a frequency converter circuit, which permits the application of AGC to the converter circuit without attendant shifts in the frequency of the circuit and the reception of signals by the receiving system over a relatively wide frequency range.

In accordance with the invention, a voltage controlled variable capacitance device is connected in a frequency converter circuit employing a transistor as the active element, such that the voltage across the device is varied upon the application of automatic gain control to the transistor. The capacity of the device, of which a semi-conductor junction diode is an example, is varied as the voltage across it is varied. These capacity variations are introduced in the oscillator circuit portion of the converter to cause a variation in the oscillator frequency. The capacity variations so introduced are effective to compensate for variations in the input capacity of the transistor as automatic gain control is applied to the transistor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
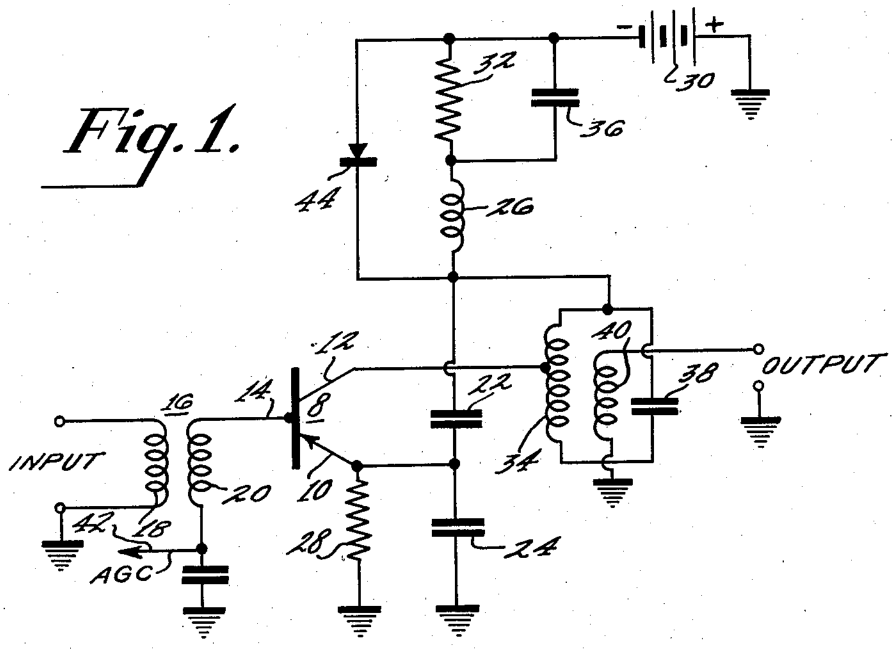
Figures 1, 3 and 4 are schematic circuit diagrams of frequency converter circuits embodying the invention.

Referring now to the drawing wherein like parts are indicated by like reference numerals throughout the figures and referring particularly to Figure 1, a frequency converter circuit embodying the invention includes as its active element a transistor 8, which may be considered to be of the P-N-P junction type and which includes an emitter 10, a collector 12, and a base 14. Input signals from a radio frequency amplifier, or directly from an antenna, are applied to the base 14 through an input transformer 16, having a primary winding 18 and a secondary winding 20. To generate a local oscillator signal regenerative feedback is provided between the collector 12 and the emitter 10 of the transistor 8. This is accomplished in the present example through a circuit including a capacitor divider comprising two capacitors 22 and 24, which are the capacitive elements of an oscillator tuned circuit having an oscillator coil or inductor 26 as the inductive element. The emitter 10 is connected to the junction of the capacitors 22 and 24, while the other electrode of the capacitor 24 is connected to a point of reference potential or circuit ground. The remaining electrode of the second oscillator capacitor 22 is connected to one terminal of the oscillator coil 26. The emitter 10 is connected to ground through a degenerative stabilizing resistor 28.

To supply operating biasing potentials for the transistor 8, a direct-current supply source, such as a battery 30, is provided, the positive terminal of which is grounded. The negative terminal of the battery 30 is connected through a voltage dropping resistor 32, the purpose of which will be discussed in more detail hereinafter, the oscillator coil 26, and a portion of an inductive winding 34 of the I.F. output circuit, to the collector 12 of the transistor 8. The voltage dropping resistor 32 is by-passed by a by-pass capacitor 36. The tuned output circuit also includes a shunt tuning capacitor 38 for the winding 34. Output signals may be derived, as indicated, through an output coupling coil or winding 40, which is in inductive coupling relation with the winding 34. AGC is applied to the converter circuit in the present example through a lead 42, which is connected through the secondary winding 20 of the input transformer 16 to the base electrode 14. As will hereinafter be shown, the AGC lead 42 may be connected with the detector of the receiver, for example, such that with an increase in signal strength AGC current flows into the base 14. This current increases with increases of the signal strength and operates to reduce the emitter current and thus the gain of the transistor 8.

To stabilize the frequency of the converter circuit and prevent undesired frequency shifts as AGC current is applied to the base 14, a device having a voltage controlled variable capacitance such as a semi-conductor junction diode 44 is connected, in accordance with the invention, between the negative terminal of the biasing battery 30 and the junction of the oscillator coil 26 and the oscillator capacitor 22. The junction diode 44, which is connected in shunt relation with the oscillator coil 26, is coupled with the inductor 26 and effectively connected in the oscillator tuned circuit of the converter.

As was explained hereinbefore, the application of AGC to a transistor converter will reduce the input capacity of the transistor used therein as the emitter current of the transistor is reduced. This tends to cause an undesired shift in the oscillator frequency of the converter circuit. By provision of the present invention, however, these undesired shifts in oscillator frequency as the emitter current of the transistor is varied are compensated for. The magnitude of the collector resistor 32 is so chosen that the direct-current voltage drop across this resistor due to collector current flow of the transistor 8 is greater than the peak oscillator voltage swing at the collector 12. The voltage across the resistor 32 will decrease if the collector current of the transistor 8 decreases. The direct-current voltage drop across the resistor 32 is of a polarity to bias the diode 44 in the reverse, non-conducting direction. Since this direct-current voltage drop is greater than the peak oscillator signal on the collector 12, the diode 44 will not conduct in the forward direction in response to the collector oscillator voltage. The junction diode 44 may be of the type whose capacity varies inversely with the square root of the voltage across it. Accordingly, as the emitter current of the transistor 10 is reduced by the application of AGC current to the base 14, the direct-current collector flow through the resistor 32 will also decrease, decreasing the voltage drop across the resistor 32. Thus the capacity of the diode 44 will increase. This variation in capacity is introduced in the oscillator tuned circuit and will shift its frequency to compensate for the decrease in input capacity of the transistor 8 as its emitter current is decreased. In this manner, frequency compensation is achieved.

Figures 2, 3:
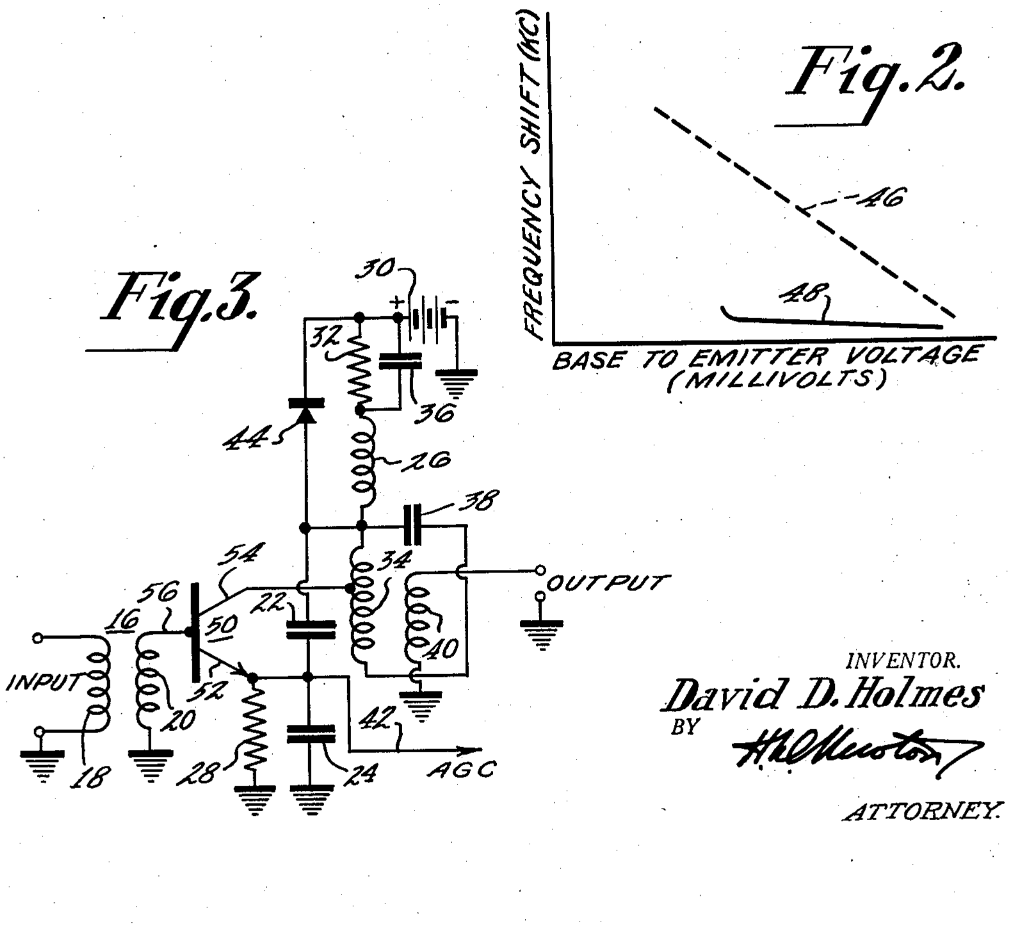
Figure 2 is a graph illustrating certain operating characteristics of a circuit of the type illustrated in Figure 1.

The above effects can be readily seen by referring to the graph of Figure 2 where frequency shift in kilocycles has been plotted against base-to-emitter voltage in millivolts. The curve 46 illustrates frequency variation as the base to emitter voltage of the transistor decreases, without compensation. The curve 48, on the other hand, depicts variations of frequency with variations in base-to-emitter voltage (as by the application of AGC) of a transistor converter which is compensated according to the invention. In the particular example a converter circuit embodying the invention is highly effective in reducing frequency shift an order of magnitude, the frequency shift in this case being less than one kilocycle over the range of practical gain control.

While it will be understood that the circuit specifications may vary according to the design for any particular application, the following circuit specifications are included for the circuit of Figure 1 by way of example only:

| | |
|---|---|
| Transistor **8** | Commercial type 2N140. |
| Resistors **28** and **32** | 2,000 and 5,600 ohms respectively. |
| Capacitors **22**, **24** and **36** | .0039, .01, and 0.1 microfarad, respectively. |
| Battery **30** | 12 volts. |
| Diode **44** | Collector diode of type 2N139 transistor. |

In Figure 3, a frequency converter circuit embodying the invention is similar to the embodiment illustrated in Figure 1. The transistor 50 in this embodiment may be considered to be of the N–P–N junction type, and includes emitter 52, collector 54, and base 56 electrodes. To provide biasing voltages of the proper polarity for this type transistor, the battery 30 is poled in the opposite direction from its polarity in the circuit of Figure 1, the negative terminal being grounded. Since the frequency compensating diode 44 must be poled such that it is biased in the reverse direction, it is poled in the circuit illustrated in Figure 3 in an opposite direction from its polarity in the circuit of Figure 1. In the circuit illustrated in Figure 3 it will be noted that the AGC current or voltage is applied directly to the emitter 52 through the lead 42. In operation, however, the circuit illustrated in Figure 3 is similar to the circuit illustrated in Figure 1 and incorporates the identical advantages of the former circuit.

Figure 4:
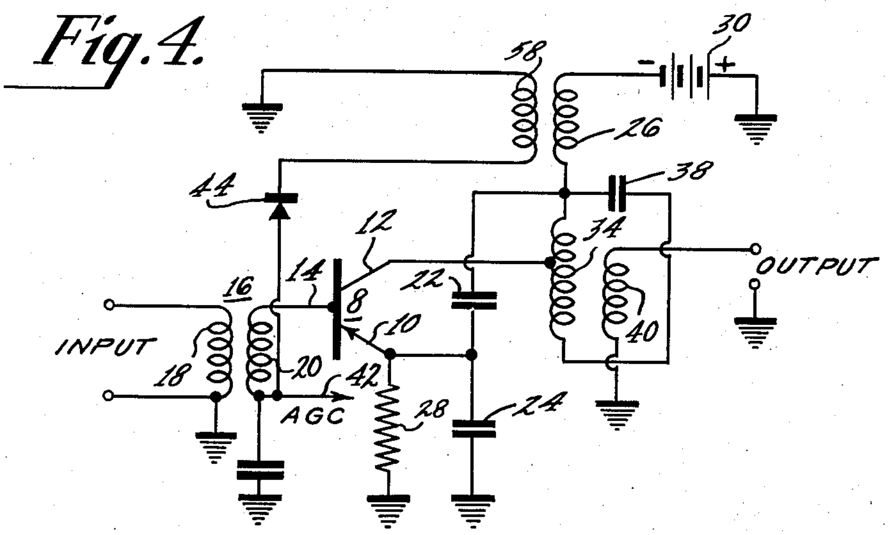

Another embodiment of the invention is illustrated in Figure 4, reference to which is now made. In this embodiment, a P–N–P transistor 8 is used, and the voltage across the voltage-frequency compensating diode 44 is varied directly by the AGC voltage. The compensating diode 44 is connected with the AGC lead 42 and to ground through an inductive winding 58, which is in close inductive coupling relation with the oscillator coil 26. The diode 44 is thus connected in the circuit so that the AGC voltage which is applied to the base 14 through the lead 42 biases the diode in the reverse direction. The AGC voltage will normally vary between −1 volt to near zero or ground potential. In operation, variation of the AGC voltage varies the voltage across the diode 44 which varies the capacity of the diode. These capacity variations are reflected across the oscillator tuned circuit through the inductive coupling between the winding 58 and the oscillator coil 26, and in magnitude determined by the turns ratio between the winding 58 and the coil 26. This variation in the capacity of the oscillator tuned circuit operates to compensate, as in Figures 1 and 3, for variations in frequency due to shifts in the input capacity of the transistor 8 with the application of AGC.

Figure 5:
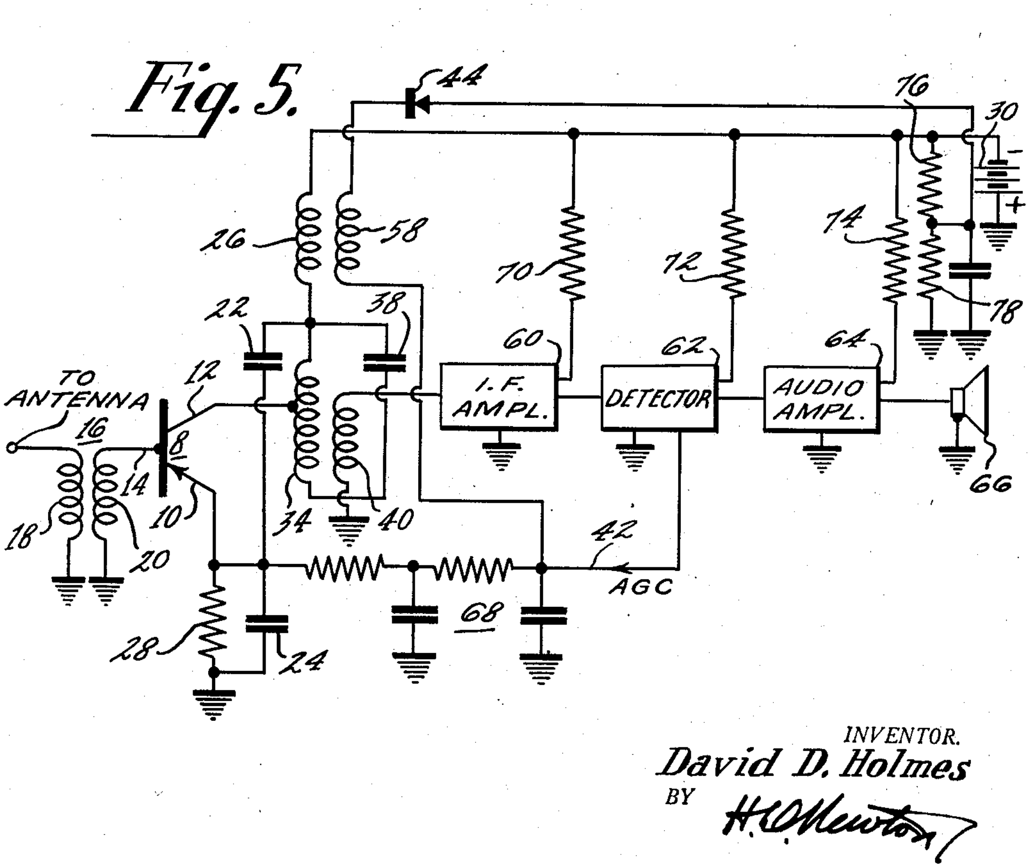
Figure 5 is a schematic circuit diagram, partially in block diagram form, of a radio signal receiving system employing a frequency converter circuit embodying the invention.

Referring to Figure 5, a radio receiver embodying the invention includes the frequency converter transistor 8 and an intermediate frequency (I.F.) amplifier 60, a detector 62, an audio amplifier 64, and a loudspeaker 66. The transistor frequency converter circuit is of the same general type as the one illustrated in Figure 3. To control the gain of the converter transistor 8 with variations in signal level, an AGC current or voltage is applied from the detector 62 through the lead 42 and a filter network 68 to the emitter 10 of the converter transistor 8.

To supply biasing potentials for the I.F. amplifier 60, the detector 62, and the audio amplifier 64, the negative terminal of the biasing battery 30 is connected through respective resistors 70, 72, and 74 to these various stages. To provide a suitable biasing voltage for reverse-biasing the diode 44, the negative terminal of the battery 30 is connected to ground through a voltage divider network comprising a pair of resistors 76 and 78. The junction of the resistors 76 and 78 is connected to the anode of the compensating diode 44. The cathode of the compensating diode 44 is connected through the feedback coil 58 to the AGC lead 42.

The frequency compensating portion of the circuit operates as follows. The detector 62 is normally operative to vary the direct voltage on the AGC lead 42 from, for example, −1 volt, in the absence of a signal, to −2 volts during the reception of strong signals. The AGC voltage is applied to the emitter 10 of the transistor 8 and reduces its gain as the signal strength is increased. The AGC also causes a variation in the voltage across the compensating diode 44, the reverse voltage across the diode decreasing with an increase in the signal strength. Accordingly, the capacity across the diode 44 increases. This increase in the diode capacity is reflected across the oscillator tuned circuit of the frequency converter through the winding 58, which is in inductive coupling relation with the oscillator coil 26. The capacity variations are sufficient to compensate for the decrease in the input capacity of the transistor 8 as the AGC voltage is applied to the emitter 10.

A transistor frequency converter in accordance with the invention includes means for compensating for shifts in the oscillator frequency as AGC is applied to the converter transistor, without complicated circuitry or costly components. Thus the invention permits practical application of AGC to a transistor type converter circuit, and a wide range of input signals may be received without danger of overloading.

What is claimed is:

1. In a signal receiving system the combination with a frequency converter including a transistor as the active element thereof and an oscillator tuning circuit connected with said transistor, of frequency compensating means including a voltage-controlled variable-capacitance device coupled with said tuning circuit to provide variations in oscillator frequency as the voltage across said device is varied, and automatic gain control means connected with said converter to provide variations in the gain of said transistor and the voltage across said variable capacitance device in response to variations in signal level in said receiving system to compensate for variations in the input capacity of said transistor and provide frequency stable operation of said converter.

2. In a signal receiving system the combination with a frequency converter circuit including a transistor having base, emitter, and collector electrodes as the active element thereof and an oscillator circuit including a tuning inductor connected with said collector and emitter electrodes for generating a local oscillator signal, of frequency compensating means including a diode having a voltage controlled variable capacitance characteristic coupled with said inductor and connected in said converter circuit to provide variation in the frequency of said oscillator circuit as the voltage across said diode is varied, and automatic gain control means connected with one of said base and emitter electrodes to provide variations in the gain of said transistor and the voltage across said diode in response to variations in signal level in said receiving system to compensate for variations in the input capacity of said transistor and provide frequency stable operation of said converter circuit.

3. In a superheterodyne signal receiving system the combination with a frequency converter circuit including a transistor having base, emitter, and collector electrodes, and means for generating a local oscillator signal including a tuned oscillator circuit and a regenerative feedback connection between said collector and emitter electrodes, of frequency compensating means including a junction diode having a voltage controlled variable capacitance characteristic coupled with said oscillator circuit to provide variations in the tuning thereof as the voltage across said diode is varied, signal input means connected for applying an input signal to said base electrode for heterodyning with said local oscillator signal, and automatic gain control means connected with said transistor to provide a variation in the gain thereof and to vary the voltage across said diode in response to variations in signal level in said receiving system, said diode providing capacity variations in response to said voltage variations to compensate for variations in the input capacity of said transistor and minimize frequency shifts of said oscillator circuit.

4. A frequency converter circuit as defined in claim 3, wherein said automatic gain control means is connected with the base electrode of said transistor.

5. A frequency converter circuit as defined in claim 4, wherein said tuned oscillator circuit includes an oscillator coil connected with said collector electrode and said diode is connected in shunt with said coil.

6. A frequency converter circuit as defined in claim 4, wherein said tuned oscillator circuit includes an oscillator coil, and said diode and an inductor in inductive coupling relation with said coil are connected between said base electrode and a point of reference potential in said circuit.

7. A frequency converter circuit as defined in claim 3, wherein said automatic gain control means is connected with the emitter electrode of said transistor.

8. A frequency converter circuit as defined in claim 7, wherein said tuned oscillator circuit includes an oscillator coil, and said diode and an inductor in inductive coupling relation with said coil are connected between said emitter electrode and a point of fixed potential in said circuit.

9. A frequency converter circuit as defined in claim 7, wherein said tuned oscillator circuit includes an oscillator coil connected with said collector electrode and said diode is connected in shunt with said coil.

10. A frequency converter circuit for signal receiving systems and the like and including a transistor as the active element thereof comprising, in combination, means providing an oscillator circuit connected with said transistor for generating an oscillator signal, frequency compensating means including a voltage-controlled variable-capacitance device coupled with said oscillator circuit to provide variations in the frequency thereof in response to voltage variations across said device, and automatic gain control means connected in said converter circuit to provide variations in the gain of said transistor and the voltage across said variable capacitance device in response to a received signal to stabilize the frequency of said oscillator circuit with variations in the input capacity of said transistor.

11. In a signal receiving system the combination with a frequency converter circuit including a transistor having base, emitter, and collector electrodes, and means including a tuned circuit connected with said transistor providing regenerative signal feedback between said collector and emitterr electrodes for generating a local oscillator signal, of signal input means connected for applying an input signal to said base electrode for heterodyning with said oscillator signal, a direct-current supply source and a resistor connected with said collector electrode, said resistor having resistance of a magnitude to provide a voltage drop thereacross in excess of the peak collector signal voltage of said transistor, frequency compensating means including a junction diode connected with said supply means and in parallel with said resistor, said diode being poled in said circuit to be reverse biased by said supply source, and automatic gain control means connected with said transistor to vary the gain thereof and the voltage across said resistor in response to variations in the signal level of said receiving system, the voltage variations across said resistor being applied to said diode to vary the capacitance thereof and the frequency of said tuned circuit to stabilize the frequency of a generated oscillator signal with variations in the input capacity of said transistor.

12. A frequency converter circuit as defined in claim 11, wherein said automatic gain control means is connected with the base electrode of said transistor.

13. A frequency converter circuit as defined in claim 11, wherein said automatic gain control means is connected with the emitter electrode of said transistor.

14. In a signal receiving system the combination with a frequency converter circuit including a transistor having base, emitter, and collector electrodes, and means including a tuned circuit connected with said transistor providing regenerative signal feedback between said collector and emitter electrodes for generating a local oscillator signal, said tuned circuit including an oscillator coil connected with said collector electrode, of signal input means connected for applying an input signal to said base electrode for heterodyning with said oscillator signal, frequency compensating means including a junction diode and an inductor connected with said transistor, said inductor being in coupling relation with said oscillator coil, and automatic gain control means connected with said transistor and with said diode to vary the gain of said transistor and the voltage across said diode in response to variations in the signal level of said receiving system, said diode providing capacitance variations in response to the voltage variations provided by said gain control means to vary the frequency of said tuned circuit through the coupling of said oscillator coil and said inductor, whereby the frequency of a generated oscillator signal is stabilized with variations in the input capacity of said transistor.

15. A frequency converter circuit as defined in claim 14, wherein said diode and inductor are connected between said base electrode and a point of reference potential, and said automatic gain control means is connected with said base electrode.

16. A frequency converter circuit as defined in claim 14, wherein said diode and said inductor are connected between said emitter electrode and a direct current supply source, said supply source being poled in said circuit to reverse bias said diode, and wherein said automatic gain control means is connected with said emitter electrode.

References Cited in the file of this patent

UNITED STATES PATENTS

| | | |
|---|---|---|
| 2,128,649 | Kinross et al. | Aug. 30, 1938 |
| 2,182,377 | Guanella | Dec. 5, 1939 |
| 2,243,921 | Rust et al. | June 3, 1941 |

OTHER REFERENCES

Pub. 1. I.R.E. Trans. on BC and TV Receivers, vol. BTR-1, No. 2, April 1955, pages 1-15.